(12) United States Patent
Qian et al.

(10) Patent No.: US 10,199,109 B2
(45) Date of Patent: Feb. 5, 2019

(54) LOW POWER SENSE AMPLIFIER FOR A FLASH MEMORY SYSTEM

(71) Applicant: Silicon Storage Technology, Inc., San Jose, CA (US)

(72) Inventors: Xiaozhou Qian, Shanghai (CN); Xiao Yan Pi, Shanghai (CN); Kai Man Yue, Shanghai (CN); Qing Rao, Shanghai (CN); Lisa Bian, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/371,496

(22) Filed: Dec. 7, 2016

(65) Prior Publication Data

US 2017/0194055 A1 Jul. 6, 2017

(30) Foreign Application Priority Data

Dec. 31, 2015 (CN) .......................... 2015 1 1030454

(51) Int. Cl.
| | |
|---|---|
| *G11C 16/28* | (2006.01) |
| *G11C 16/26* | (2006.01) |
| *G11C 16/24* | (2006.01) |
| *G11C 7/06* | (2006.01) |
| *G11C 7/14* | (2006.01) |
| *G11C 16/04* | (2006.01) |
| *G11C 16/32* | (2006.01) |

(52) U.S. Cl.
CPC .............. *G11C 16/26* (2013.01); *G11C 7/062* (2013.01); *G11C 7/067* (2013.01); *G11C 7/14* (2013.01); *G11C 16/24* (2013.01); *G11C 16/28* (2013.01); *G11C 16/0483* (2013.01); *G11C 16/32* (2013.01)

(58) Field of Classification Search
CPC ... G11C 11/4097; G11C 7/18; G11C 11/4091; G11C 7/12; G11C 11/5642
USPC .................................................... 365/185.21
See application file for complete search history.

(56) References Cited

U.S. PATENT DOCUMENTS

| | | | |
|---|---|---|---|
| 4,982,380 A * | 1/1991 | Koike ................. | G11C 7/1051 |
| | | | 365/189.05 |
| 5,933,366 A * | 8/1999 | Yoshikawa ......... | G11C 11/5621 |
| | | | 365/185.03 |
| 6,272,062 B1 | 8/2001 | Mueller | |
| 7,280,405 B2 | 10/2007 | Sarig | |
| 8,391,071 B2 | 3/2013 | Takahashi | |
| 8,964,477 B2 | 2/2015 | Tanaka | |
| 2002/0000854 A1* | 1/2002 | Hashimoto .......... | G11C 7/1066 |
| | | | 327/158 |
| 2008/0080235 A1* | 4/2008 | Tran ...................... | G11C 5/147 |
| | | | 365/185.03 |
| 2012/0155177 A1* | 6/2012 | Wang ..................... | G11C 16/28 |
| | | | 365/185.17 |
| 2015/0078081 A1* | 3/2015 | Zhou ....................... | G11C 7/14 |
| | | | 365/185.03 |
| 2016/0254060 A1* | 9/2016 | Pi ........................... | G11C 7/062 |
| | | | 365/185.21 |

\* cited by examiner

*Primary Examiner* — Hoai V Ho
*Assistant Examiner* — Minh Dinh
(74) *Attorney, Agent, or Firm* — DLA Piper LLP (US)

(57) ABSTRACT

Multiple embodiments of a low power sense amplifier for use in a flash memory system are disclosed. In some embodiments, the loading on a sense amplifier can be adjusted by selectively attaching one or more bit lines to the sense amplifier, where the one or more bit lines each is coupled to an extraneous memory cell.

6 Claims, 8 Drawing Sheets

LOW POWER SENSE AMPLIFIER FOR A FLASH MEMORY SYSTEM

PRIORITY CLAIM

This application claims priority to Chinese Patent Application No. 201511030454.4 filed on Dec. 31, 2015 and titled "Low Power Sense Amplifier For A Flash Memory System" which is incorporated by reference herein.

TECHNICAL FIELD

Multiple embodiments of a low power sense amplifier for use in a flash memory system are disclosed.

BACKGROUND OF THE INVENTION

Flash memory systems are well-known. In typical flash memory systems, a sense amplifier is used to read data from a flash memory cell. FIG. 1 depicts a prior art sense amplifier 100. Sense amplifier 100 comprises selected flash memory cell 102, which is the cell to be read. Sense amplifier 100 also comprises reference flash memory cell 122, against which selected flash memory cell 102 is compared. PMOS transistors 104, 106, 124, and 126 and NMOS transistors 108, 110, 112, 128, and 130 are arranged as shown. PMOS transistor 104 is controlled by CASREF (column address strobe reference), PMOS 106 is controlled by SEN_B (sense amplifier enable, active low), NMOS transistors 108, 112, and 128 are controlled by ATD (address transition detection, which detects a change in the received address), and NMOS transistors 110 and 130 are controlled by YMUX (Y multiplexor) which activates a BL (bit line). Selected flash memory cell 102 receives WL (word line) and SL (source line), and reference memory cell 122 receives SL (source line). Comparator 130 receives two inputs that are directly related to the current drawn by selected flash memory cell 102 and reference memory cell 122, and the output SOUT is directly indicative of the data value stored in selected flash memory cell 102.

One drawback of prior art sense amplifier 100 is that a constant current is drawn by reference memory cell 122 and its associated circuitry, which results in significant power consumption. In addition, reference memory cell 122 and its associated circuitry typically are provided in a separate read bank than the read bank in which selected memory cell 102 is located, which requires a large die area and more power consumption for additional Y-decoding. Also, the CASREF signal also is sensitive to noise, and the CASREF circuit also consumes significant standby current.

What is needed is an improved sense amplifier design for a flash memory system that consumes less power than prior art sense amplifier solutions. What is further needed is an embodiment of a sense amplifier that does not require a separate read bank of memory cells. What is further needed is a sense amplifier that can accurately detect small differences in current drawn by selected flash memory cell 102 and reference memory cell 122, as might be required during a Margin0/1 mode.

SUMMARY OF THE INVENTION

Multiple embodiments of a low power sense amplifier for use in a flash memory system are disclosed.

DETAILED DESCRIPTION OF THE PREFERRED EMBODIMENTS

Figure 1:
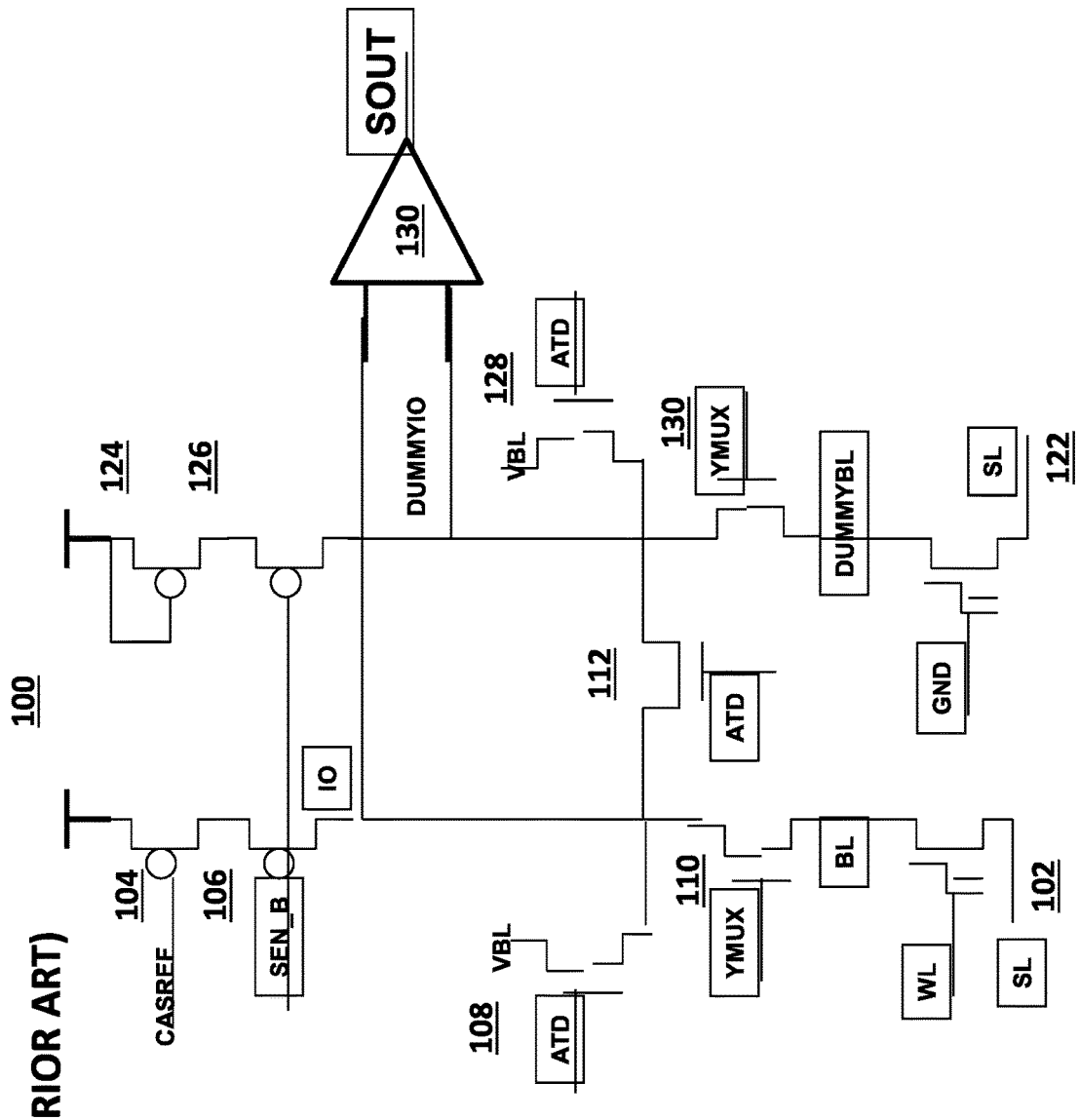
FIG. 1 depicts a prior art sense amplifier in a flash memory system.
Figure 2:
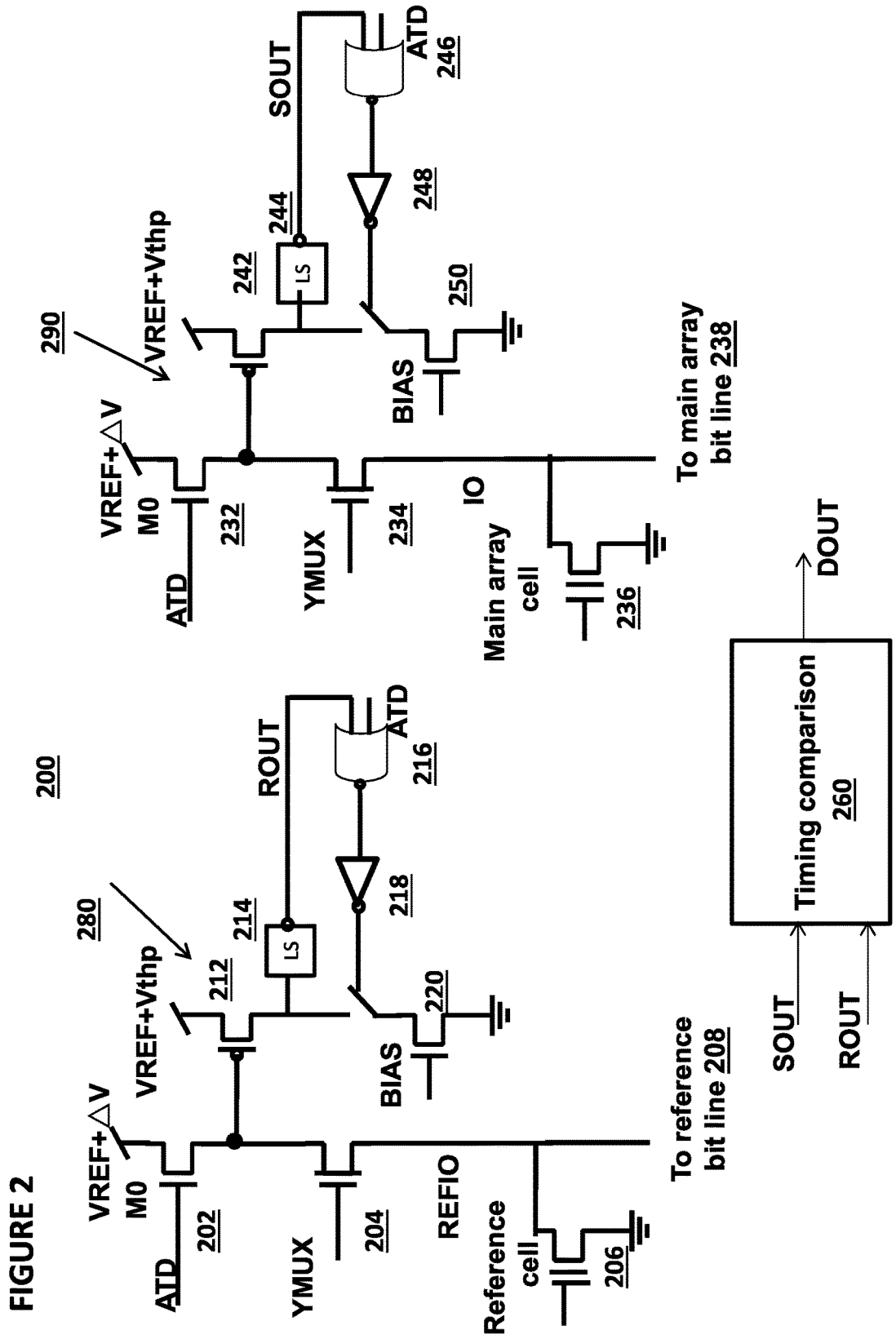
FIG. 2 depicts an embodiment of a low power sense amplifier for a flash memory system.

FIG. 2 depicts sense amplifier 200. Sense amplifier 200 comprises reference circuit 280 and read circuit 290.

Reference circuit 280 comprises reference memory cell 206, NMOS transistors 202, 204, and 220, PMOS transistor 212, reference bit line 208, level shifter 214, inverter 218, and NOR gate 216, all configured as shown. NMOS transistor 202 is controlled by ATD (address transition detection), NMOS transistor 204 is controlled by YMUX (Y multiplexor), and NMOS transistor 220 is controlled by a BIAS signal. NOR gate 216 receives ATD as one of its inputs.

Read circuit 290 comprises selected memory cell 236, NMOS transistors 232, 234, and 250, PMOS transistor 242, bit line 238, level shifter 244, inverter 248, and NOR gate 246, all configured as shown. NMOS transistor 232 is controlled by ATD (address transition detection), NMOS transistor 234 is controlled by YMUX (Y multiplexor), and NMOS transistor 250 is controlled by a BIAS signal. NOR gate 246 receives ATD as one of its inputs. Thus, reference circuit 280 and read circuit 290 are identical, except that reference circuit 280 comprises reference memory cell 206, and read circuit 290 comprises selected memory cell 236.

In operation, sense amplifier 200 works as follows. Prior to a read operation, the BIAS signal is high, which pulls the voltage at the output of inverters 218 and 248 to ground through NMOS transistors 220 and 250, which causes ROUT and SOUT to be high. At the beginning of a read operation, ATD goes high, which signifies a detection in the change of the address received by the memory system, which coincides with the beginning of a read operation. NMOS transistors 202 and 232 are turned on, as are NMOS transistors 204 and 234 by YMUX. This allows reference cell 206 and selected memory cell 236 to draw current. Concurrently, reference bit line 208 and bit line 238 will begin charging. BIAS also goes low at the beginning of the read operation. At this stage, PMOS transistors 212 and 242 are off, as the voltage on its gate will be high.

ATD will then go low, which shuts off NMOS transistors 202 and 232. Reference bit line 208 will begin discharging through reference cell 206. As it does so, the voltage of reference bit line 208 will decrease, and at some point will drop low enough (below VREF) such that PMOS transistor 212 turns on. This causes ROUT to drop to low. Meanwhile, bit line 238 also is discharging through selected memory cell 236. As it does so, the voltage of bit line 238 will decrease, and at some point will drop low enough (below VREF) such that PMOS transistor 242 turns on. This causes SOUT to drop to low. Once ROUT/SOUT drop to low, each sense amplifier has a local feedback (216, 218 or 246, 248) to cut off its bias current, which reduces the power consumption.

Essentially, there is a race condition between reference circuit 280 and read circuit 290. If selected memory cell 236 draws more current than reference cell 206 (which would be the case if selected memory cell 236 is storing a "1" value), then SOUT will drop to low before ROUT drops to low. But if selected memory cell 236 draws less current than reference cell 206 (which would be the case if selected memory cell 236 is storing a "0" value), then SOUT will drop to low after ROUT drops to low. Thus, the timing of SOUT and ROUT dropping to low indicates the value stored in selected memory cell 236.

SOUT and ROUT are input into timing comparison circuit 260, and the output is DOUT, which indicates the value stored in selected memory cell 236.

Figure 3A:
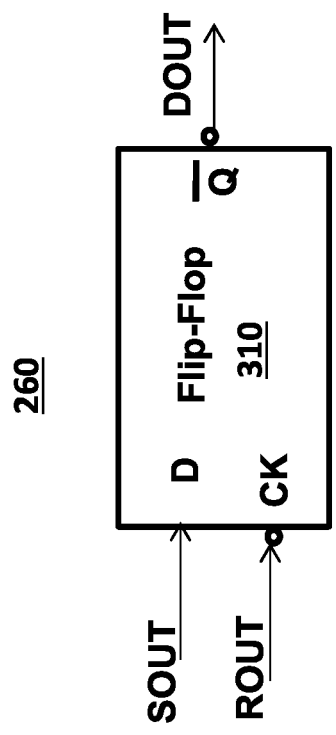
FIG. 3A depicts a timing comparison circuit for use in the low power sense amplifier of FIG. 2.

FIG. 3A depicts a first embodiment of timing comparison circuit 260. Here, timing comparison circuit 260 comprises flip-flop 310, with SOUT as the D input, ROUT as the active low clock CK, and DOUT as the output. When ROUT goes low before SOUT, then DOUT will output a "0," indicating that selected memory cell 236 is storing a "0." When ROUT goes low after SOUT, then DOUT will output a "1," indicating that selected memory cell 236 is storing a "1".

Figure 3B:
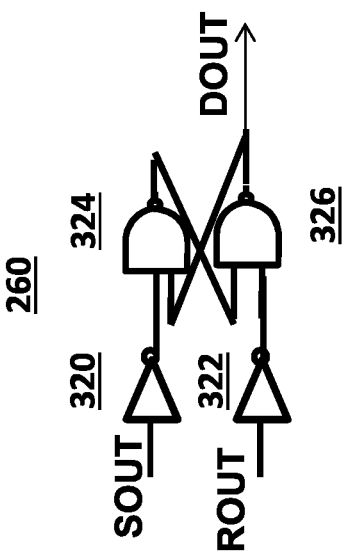
FIG. 3B depicts another timing comparison circuit for use in the low power sense amplifier of FIG. 2.

FIG. 3B depicts a second embodiment of timing comparison circuit 260. Timing comparison circuit 260 comprises inverters 320 and 322 and NAND gates 324 and 326 configured as shown, with SOUT and ROUT as inputs, and DOUT as the output. When ROUT goes low before SOUT, then DOUT will output a "0," indicating that selected memory cell 236 is storing a "0." When ROUT goes low after SOUT, then DOUT will output a "1," indicating that selected memory cell 236 is storing a "1."

Figure 4:
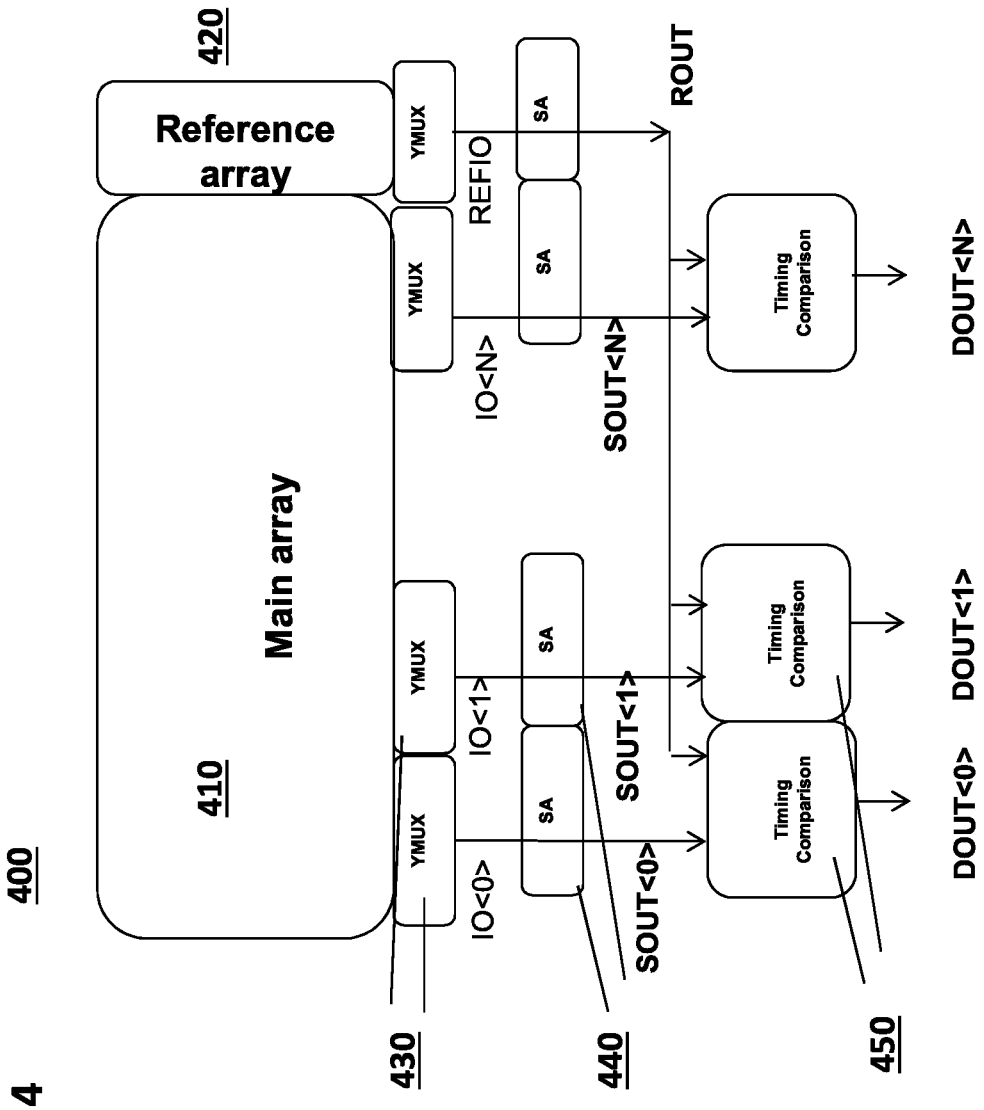
FIG. 4 depicts a flash memory system utilizing one of the sense amplifier embodiments disclosed herein.

FIG. 4 depicts flash memory system 400 utilizing sense amplifier 200 of FIGS. 2, 3A, and 3B. Flash memory system 400 comprises main array 410 (comprising an array of flash memory cells, such as selected flash memory cell 236), reference array 420 (comprising an array of reference memory cells, such as reference memory cell 206), N+1 YMUX's 430, N+1 sense amplifiers 440 (each according to the design of sense amplifier 200), and N+1 timing comparison circuits 450 (each according the design of FIG. 3A or 3B). Here, flash memory system 400 is capable of reading (sensing) N+1 bits at a time. Each bit is associated with one YMUX 430, one sense amplifier 440, and one timing comparison circuit 450 is used.

Sense amplifier 200 consumes less power than prior art sense amplifier 100 Sense amplifier 200 utilizes a small bias current during the sense operation instead of a larger reference current, and the small bias current is automatically cutoff after SOUT goes low. In addition, using the same type of YMUX for the reference cell and selected memory cell results in good transistor matching. In this embodiment, an extra read bank is not required.

Figure 5:
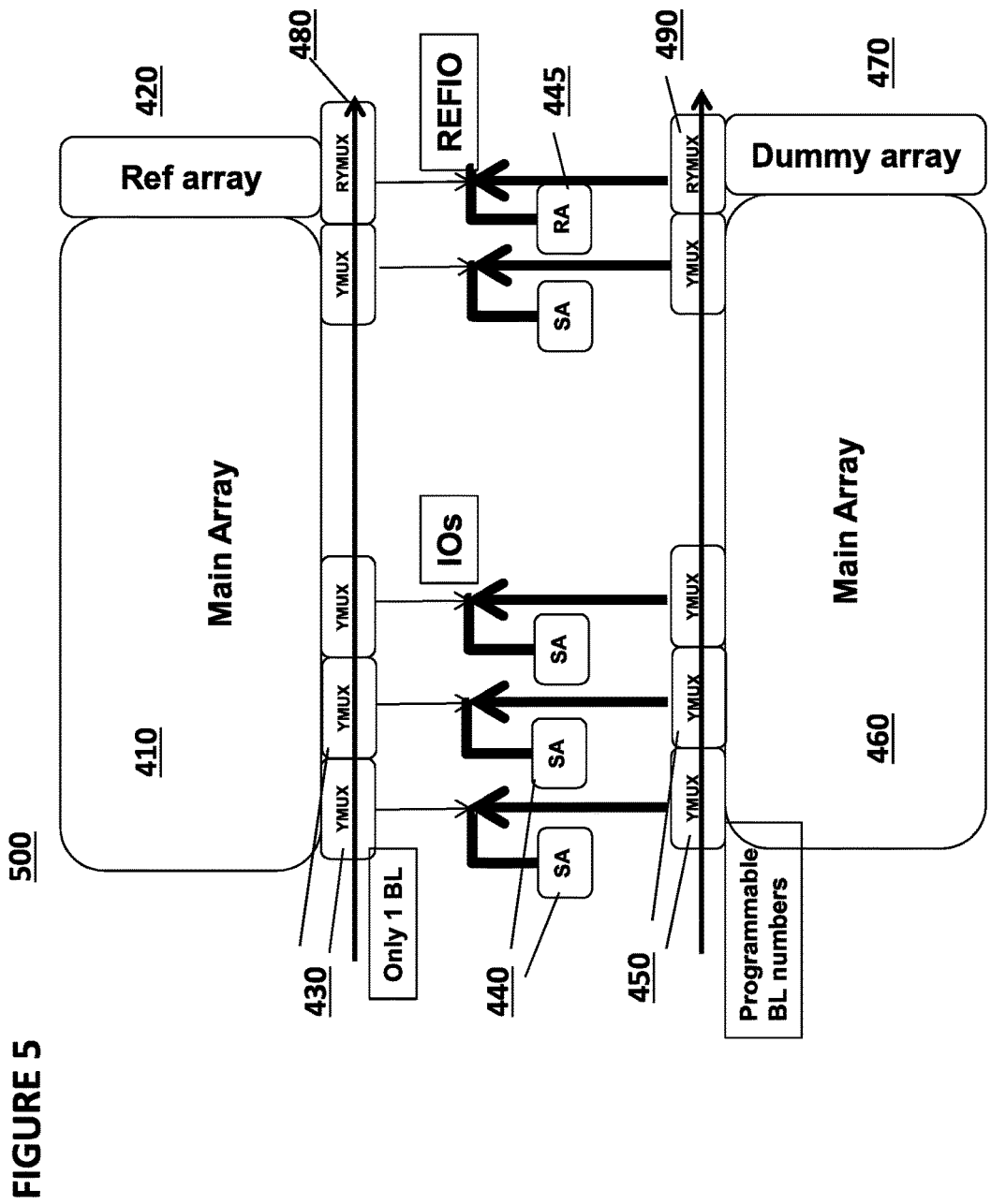
FIG. 5 depicts a flash memory system comprising sense amplifiers with programmable bit line loading.

Another embodiment is shown in FIG. 5, which depicts flash memory system 500. Flash memory system 500 comprises main array 410, reference array 420, YMUXs 430, sense amplifiers 440, reference sense amplifier 445, main array 560, dummy array 470, YMUXs 450, reference YMUX 480, and reference YMUX 490. During operation, a selected memory cell 236 is connected to one of the sense amplifiers 440. That same sense amplifier is connected to one or more bit lines coupled to memory cells in main array 560. Similarly, during operation, a reference memory cell 206 is connected to reference sense amplifier 445, which is connected to one or more bit lines coupled to memory cells in dummy array 470. Thus, the number of bit lines and memory cells connected to a sense amplifier can change, which is a desirable feature for specific operation conditions (such as margin0/1 read modes).

Figure 6:
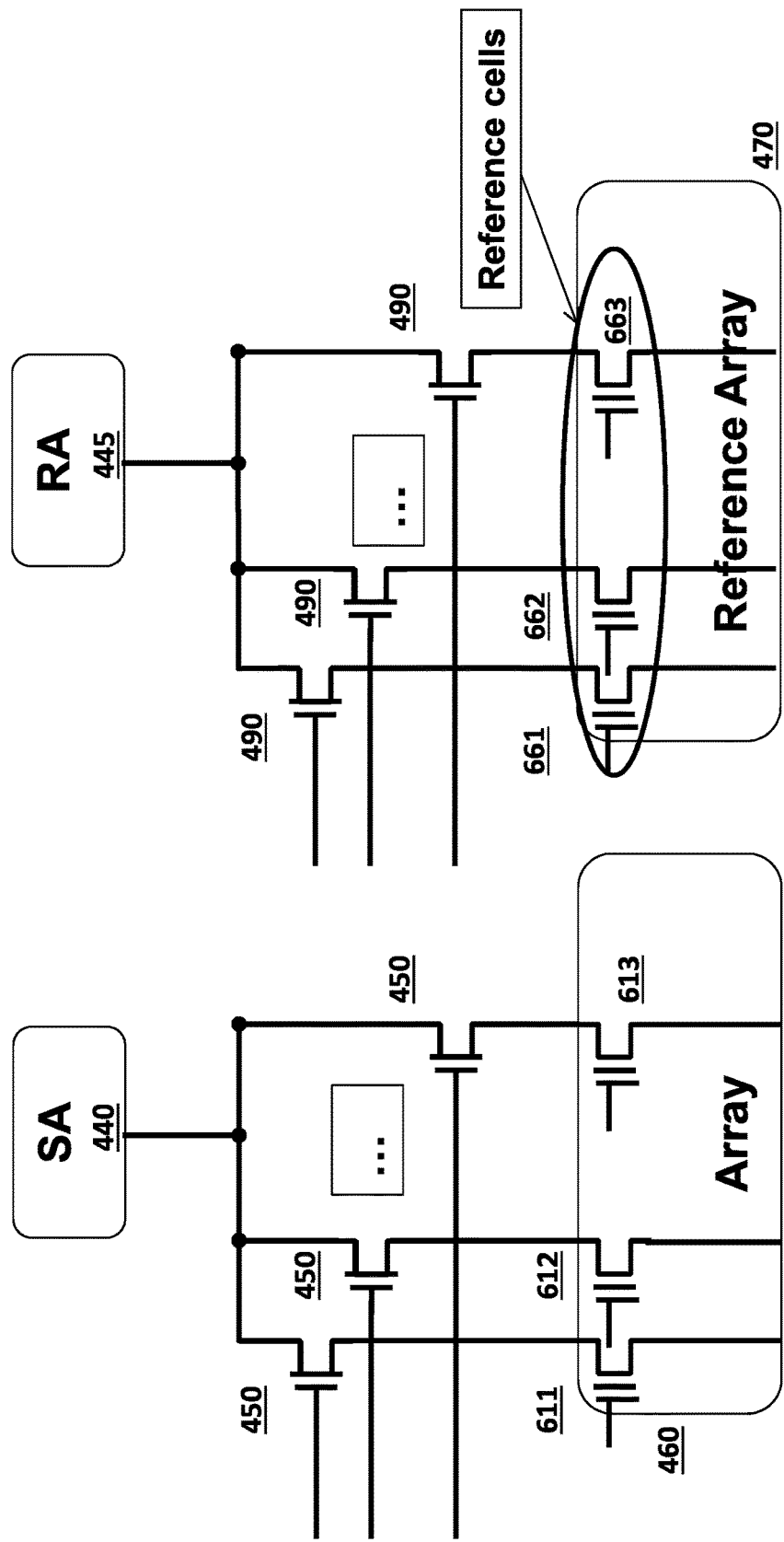
FIG. 6 depicts an embodiment of a programmable bit line loading circuit for use in the system of FIG. 5.

An embodiment of the design of FIG. 4 is shown in FIG. 6. In FIG. 6, sense amplifier 440 is selectively coupled to representative memory cells 611, 612, and 613 in main array 460 through YMUXs 450. Reference sense amplifier 445 is selectively coupled to representative reference memory cells 661, 662, and 663 in reference array 470 through RYMUXs 490. Thus, the number of bit lines and memory cells connected to a sense amplifier can change, which might is a desirable feature as operation conditions (such as temperature) changes.

Figure 7:
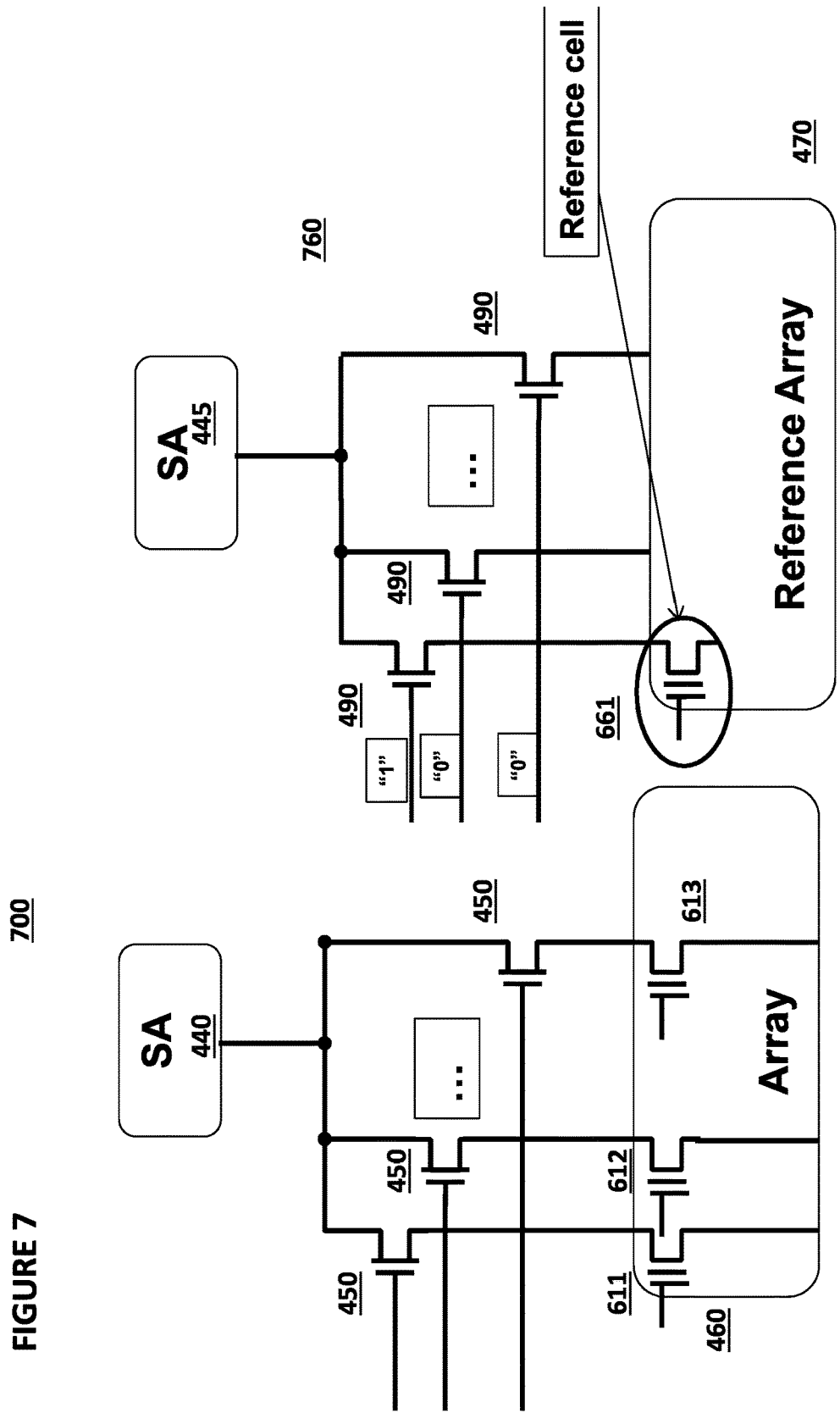
FIG. 7 depicts another embodiment of a programmable bit line loading circuit for use in the system of FIG. 5.

Another embodiment of the design of FIG. 4 is shown in FIG. 7. In FIG. 7, sense amplifier 440 is selectively coupled to representative memory cells 611, 612, and 613 in main array 460 through YMUXs 450, respectively. Reference sense amplifier 445 is coupled in a fixed manner to reference memory cells 661 in reference array 470 through RYMUX 490. Thus, in this embodiment, reference sense amplifier 445 is coupled only to one reference memory cell and bit line.

Figure 8:
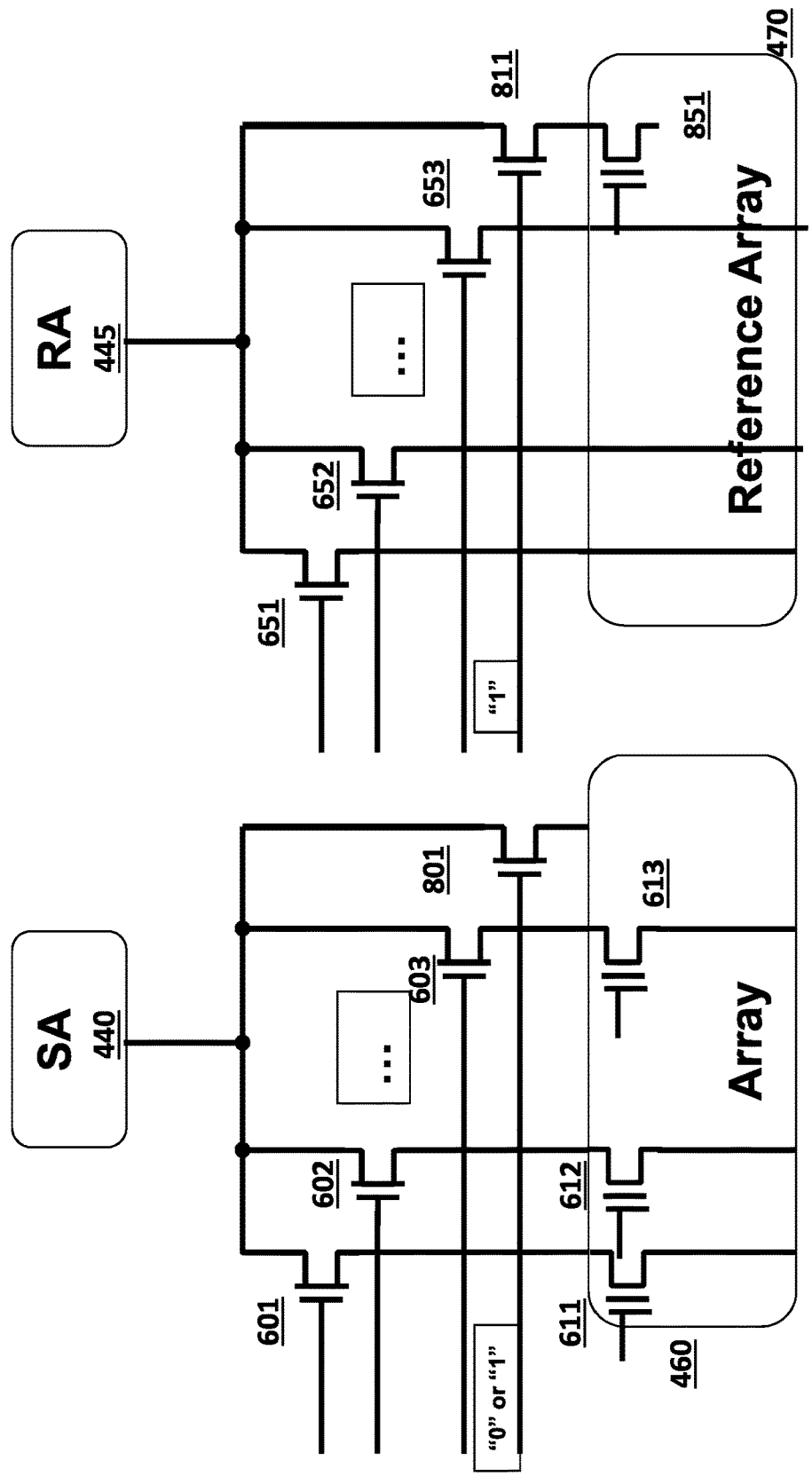
FIG. 8 depicts another embodiment of a programmable bit line loading circuit for use in the system of FIG. 5.

Another embodiment of the design of FIG. 4 is shown in FIG. 8. In FIG. 8, sense amplifier 440 is selectively coupled to representative memory cells 611, 612, and 613 in main array 460 through YMUXs 450. Sense amplifier 440 also is coupled to extra YMUX 801. Reference sense amplifier 445 is selectively coupled to representative reference memory cells 661, 662, and 663 in reference array 470 through RYMUXs 490. In addition, reference sense amplifier 445 is coupled to extra RYMUX 811 and reference memory cell 851.

The embodiment of FIG. 5 provides a new method of implementing a margin 0/1 test mode. The bit line loading on a sense amplifier is enlarged (from one bit line to N+1 bit lines) in order to distinguish very minor current differences for the 0/1 margin test mode. No current mirrors are used, which reduces both coupling and mismatching offsets of the prior art while using only a small area for the circuitry.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:
1. A flash memory system, comprising:
   a first circuit comprising a selected flash memory cell coupled to a first bit line and a first output circuit, wherein during a read operation the first bit line is discharged through the selected flash memory cell and an output of the first output circuit changes when a voltage of the first bit line turns on a PMOS transistor in the first output circuit;

a second circuit comprising a reference flash memory cell coupled to a second bit line and a second output circuit, wherein during the read operation the second bit line is discharged through the reference flash memory cell and an output of the second output circuit changes when a voltage of the second bit line turns on a PMOS transistor in the second output circuit;

a timing comparison circuit for outputting a first value when the output of the first output circuit changes before the output of the second output circuit changes during the read operation and for outputting a second value when the output of the second output circuit changes before the output of the first output circuit changes during the read operation, wherein the first value and second value each indicate a value stored in the selected flash memory cell.

2. The flash memory system of claim 1, wherein the timing comparison circuit comprises a flip-flop.

3. The flash memory system of claim 1, wherein the timing comparison circuit comprises two inverters and two NAND gates.

4. The flash memory system of claim 1, wherein the first bit line and second bit line are charged prior to the read operation.

5. The flash memory system of claim 1, wherein the selected flash memory cell is coupled to the timing comparison circuit during the read operation by a multiplexor.

6. The flash memory system of claim 5, wherein the reference flash memory cell is coupled to the timing comparison circuit during the read operation by a multiplexor.

* * * * *